(12) United States Patent
Chen et al.

(10) Patent No.: US 8,780,641 B2
(45) Date of Patent: Jul. 15, 2014

(54) METHOD AND APPARATUS FOR DYNAMIC SENSING WINDOW IN MEMORY

(75) Inventors: Han-Sung Chen, Hsinchu (TW);
Chung-Kuang Chen, Hsinchu (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 176 days.

(21) Appl. No.: 13/402,327

(22) Filed: Feb. 22, 2012

(65) Prior Publication Data
US 2013/0215687 A1  Aug. 22, 2013

(51) Int. Cl.
*G11C 11/34* (2006.01)

(52) U.S. Cl.
USPC ............ 365/185.24; 365/189.11; 365/185.18

(58) Field of Classification Search
USPC ........................... 365/185.24, 189.11, 185.18
See application file for complete search history.

(56) References Cited

U.S. PATENT DOCUMENTS

| | | | |
|---|---|---|---|
| 7,330,376 B1 | 2/2008 | Chen et al. | |
| 8,130,571 B2 * | 3/2012 | Shinagawa et al. | 365/189.19 |
| 8,391,069 B2 * | 3/2013 | Kuo et al. | 365/185.18 |

* cited by examiner

*Primary Examiner* — Son Dinh
*Assistant Examiner* — Nam Nguyen
(74) *Attorney, Agent, or Firm* — Kenta Suzue; Haynes Beffel & Wolfeld LLP

(57) ABSTRACT

A memory array is characterized by a threshold definition, which includes threshold voltage ranges representing data values stored by a part of the memory array, and a set of sense windows separating the threshold voltage ranges. The threshold definition is varied, responsive to at least one of program operations and erase operations. Such operations change a distribution of the data values stored in the memory group.

23 Claims, 14 Drawing Sheets

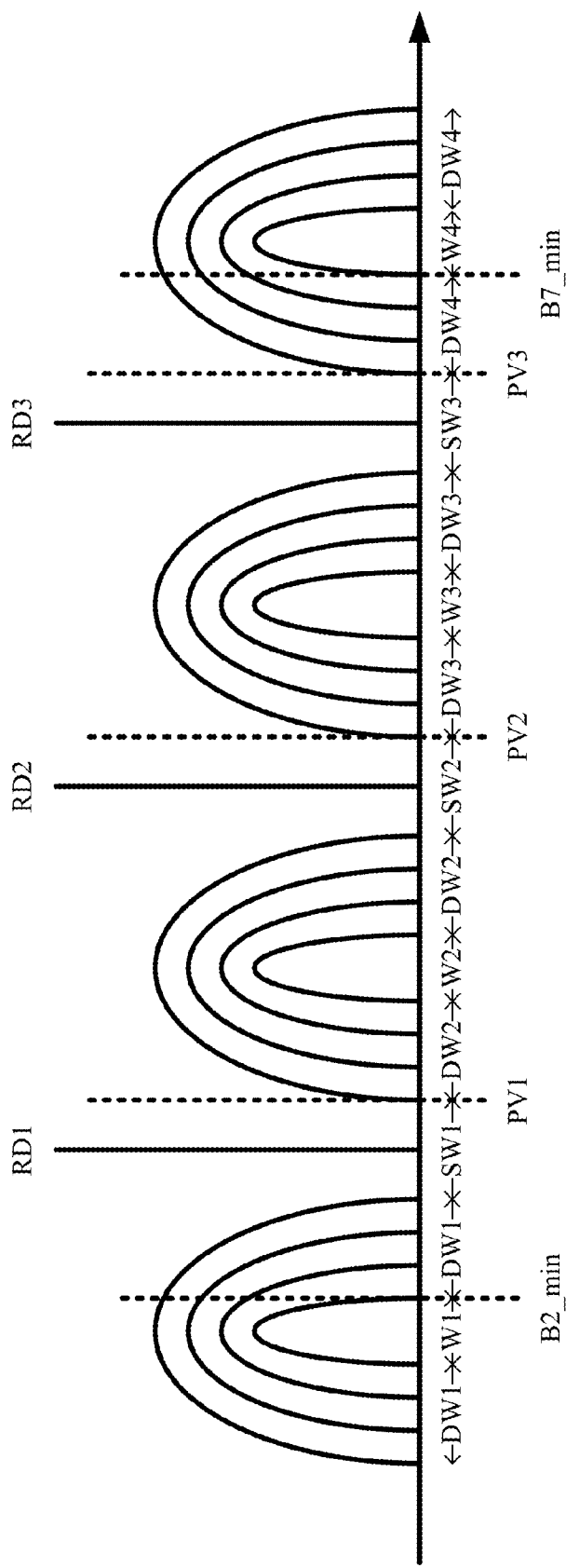

| Threshold voltage Distribution_1 representing 1st data value | Relative quantity/bit count in Distribution_1, out of all Distributions (Distribution_1, Distribution_2, Distribution_3, Distribution_4) | delta width of Distribution_1 due to relative quantity in Distribution_1 |
|---|---|---|
| distribution 10 | 0~12.5% | DW10 |
| distribution 11 | 12.5%~25% | DW11 |
| distribution 12 | 25%~37.5% | DW12 |
| distribution 13 | 37.5%~50% | DW13 |
| distribution 14 | 50%~62.5% | DW14 |
| distribution 15 | 62.5%~75% | DW15 |
| distribution 16 | 75%~87.5% | DW16 |
| distribution 17 | 87.5%~100% | DW17 |

Fig. 5

| Threshold voltage Distribution_2 representing 2nd data value | Relative quantity/bit count in Distribution_2, out of all Distributions (Distribution_1, Distribution_2, Distribution_3, Distribution_4) | delta width of Distribution_2 due to relative quantity in Distribution_2 |
|---|---|---|
| distribution 20 | 0~12.5% | DW20 |
| distribution 21 | 12.5%~25% | DW21 |
| distribution 22 | 25%~37.5% | DW22 |
| distribution 23 | 37.5%~50% | DW23 |
| distribution 24 | 50%~62.5% | DW24 |
| distribution 25 | 62.5%~75% | DW25 |
| distribution 26 | 75%~87.5% | DW26 |
| distribution 27 | 87.5%~100% | DW27 |

Fig. 6

| Threshold voltage Distribution_3 representing 3rd data value | Relative quantity/bit count in Distribution_3, out of all Distributions (Distribution_1, Distribution_2, Distribution_3, Distribution_4) | delta width of Distribution_3 due to relative quantity in Distribution_3 |
|---|---|---|
| distribution 30 | 0~12.5% | DW30 |
| distribution 31 | 12.5%~25% | DW31 |
| distribution 32 | 25%~37.5% | DW32 |
| distribution 33 | 37.5%~50% | DW33 |
| distribution 34 | 50%~62.5% | DW34 |
| distribution 35 | 62.5%~75% | DW35 |
| distribution 36 | 75%~87.5% | DW36 |
| distribution 37 | 87.5%~100% | DW37 |

Fig. 7

| Threshold voltage Distribution_4 representing 4th data value | Relative quantity/bit count in Distribution_4, out of all Distributions (Distribution_1, Distribution_2, Distribution_3, Distribution_4) | delta width of Distribution_4 due to relative quantity in Distribution_4 |
|---|---|---|
| distribution 40 | 0~12.5% | DW40 |
| distribution 41 | 12.5%~25% | DW41 |
| distribution 42 | 25%~37.5% | DW42 |
| distribution 43 | 37.5%~50% | DW43 |
| distribution 44 | 50%~62.5% | DW44 |
| distribution 45 | 62.5%~75% | DW45 |
| distribution 46 | 75%~87.5% | DW46 |
| distribution 47 | 87.5%~100% | DW47 |

Fig. 8

METHOD AND APPARATUS FOR DYNAMIC SENSING WINDOW IN MEMORY

BACKGROUND

Description of Related Art

Threshold voltage ranges of memory cells are associated with the different data values that can be stored in the memory cells. The sense windows separate the threshold voltage ranges. For example, a lower magnitude threshold voltage range can represent a data value of "1", a higher magnitude threshold voltage range can represent a data value of "0", and a sense window separates the lower magnitude threshold voltage range from the higher magnitude threshold voltage range. A wider sense window between adjacent threshold voltage ranges generally corresponds to fewer memory errors, because it becomes less likely that a particular threshold voltage of some memory cell will be determined, mistakenly, as belonging to the wrong threshold voltage range.

U.S. Pat. No. 7,330,376 discloses a memory storage method in which the threshold voltage ranges associated with the different data values for a memory unit having a number of memory cells are changed by dividing the memory unit into multiple smaller memory units each having a fewer number of memory cells. The threshold voltage range of a small memory unit is generally narrower than the threshold voltage range of a larger memory unit, for example due to less fabrication variation across a smaller area of the wafer. Accordingly, as the memory units are decreased in size, it becomes less likely that a particular threshold voltage of some memory cell will be mistakenly determined as belonging to the wrong threshold voltage range that represents the wrong data value.

However, dividing the memory units is not practical during real-time operation of a memory array, in response to ongoing memory operations such as program and erase. Also, there is a limit to improving the sense window solely by making each memory unit as small as possible. Larger memory units have countervailing advantages of decreased associated overhead when accessing the memory array.

SUMMARY

One aspect of the technology has a memory array which can be divided into a plurality of memory groups such as pages. The threshold definition is varied responsive to at least one of program operations and erase operations that change a distribution of the data values stored in a part of the memory array such as the memory group. The variation can be performed by control circuitry on the integrated circuit or a tester external to the integrated circuit. The part of the memory array is characterized by a threshold definition including (i) threshold voltage ranges representing data values stored by the part of the memory array and (ii) a set of sense windows separating the threshold voltage ranges. Other examples of memory group sizes are words, word lines, sectors, and half pages.

An example of varying the threshold definition, is varying the threshold voltage ranges, such as by deciding widths of the threshold voltage ranges based on a relative distribution of the data values. A first threshold voltage range is wider than a second threshold voltage range, responsive to part of the memory array storing a larger relative quantity of a first data value represented by the first threshold voltage range relative to a second data value represented by the second threshold voltage range.

An example of varying the threshold definition, is varying the set of sense windows, such as by varying at least one position of at least one of the sense windows in the threshold definition.

When the threshold definition for part of the memory array changes, then the access characteristics (such as for read or program operations) for the part of the memory array change. One embodiment further includes reference memory storing at least one access characteristic shift for the part of the memory array that compensates for varying of the threshold definition for the part of the memory array. Examples of an access characteristic are: a reference current shift for program verify, a word line level shift for program verify, a reference current shift for read, and a word line level shift for read. Part of the memory array is accessed according to the access characteristic shift in the reference memory.

In one embodiment, a read time of the reference memory is no longer than a word line setup time to access the part of the memory array. During the word line setup time to access the part of the memory array, the reference memory can be accessed to read the access characteristic shift for the part of the memory array. In one example with shorter read time of the reference memory, the reference memory for the part of the memory array is closer than the part of the memory array to the word line drivers. In another example with shorter read time of the reference memory, word lines accessing a second memory array including the reference memory are shorter than word lines accessing the memory array. The reference memory of the second memory array stores at least one access characteristic shift for the part of the memory array that compensates for varying of the threshold definition for the part of the memory array.

In one embodiment, the reference memory is accessed with error correcting codes.

In one embodiment, the threshold definition is varied, responsive to different relative quantities of the data values stored by the part of the memory array. Example of a relative quantities are any of a fraction, percentage, and a ratio of a first quantity of one of the data values stored in part of the memory array, relative to one or more other quantities of one or more other data values stored in part of the memory array.

Another aspect of the technology is a method, including, varying a threshold definition of a part of the memory array, responsive to at least one of program operations and erase operations that change a distribution of the values stored in the part of the memory array. The part of the memory array is characterized by the threshold definition including (i) a plurality of threshold voltage ranges representing data values stored by the part of the memory array and (ii) a set of sense windows separating the plurality of threshold voltage ranges.

Examples of varying the threshold definition are disclosed herein, such as varying at least one position of at least one of the sense windows in the threshold definition.

Another embodiment includes, reading reference memory storing at least one access characteristic shift for the part of the memory array that compensates for varying of the threshold definition for the part of the memory array; and accessing the part of the memory array according to the at least one access characteristic shift.

Another embodiment includes, reading reference memory storing at least one access characteristic shift for the part of the memory array that compensates for varying of the threshold definition for the part of the memory array, within a read time that is no longer than a setup time to access the part of the memory array.

One aspect of the technology has a memory array which can be divided into a plurality of memory groups such as pages. The threshold definition is varied based on different relative quantities of the data values stored by the part of the array. The part if the memory array is characterized by a threshold definition including (i) threshold voltage ranges representing data values stored by the part of the memory array and (ii) a set of sense windows separating the threshold voltage ranges. Other examples of memory group sizes are words, word lines, sectors, and half pages.

In one embodiment, the threshold definition is varied, responsive to at least one of program operations and erase operations that change a distribution of the data values stored in part of the memory array.

In one embodiment, the relative quantities are any of a fraction, percentage, and a ratio of a first quantity of one of the data values stored in the part of the memory array relative to one or more other quantities of one or more other data values stored in the part of the memory array.

BRIEF DESCRIPTION OF THE DRAWINGS

FIG. 4 is a threshold definition, showing threshold voltage ranges representing different data values, and sense windows separating the threshold voltage ranges, where the threshold voltage ranges have varying widths.

FIGS. 5-8 are tables showing that, as a memory group such as a page stores a different relative quantity (relative bit count) of a particular data value, the following vary: the threshold voltage distribution representing the particular data value, and the delta width which determines the threshold voltage range representing the particular data value.

DETAILED DESCRIPTION

The shown examples have four possible data values in a memory cell. Other examples can have two possible data values, eight possible data values, or some other possible number of data values.

Figure 1:
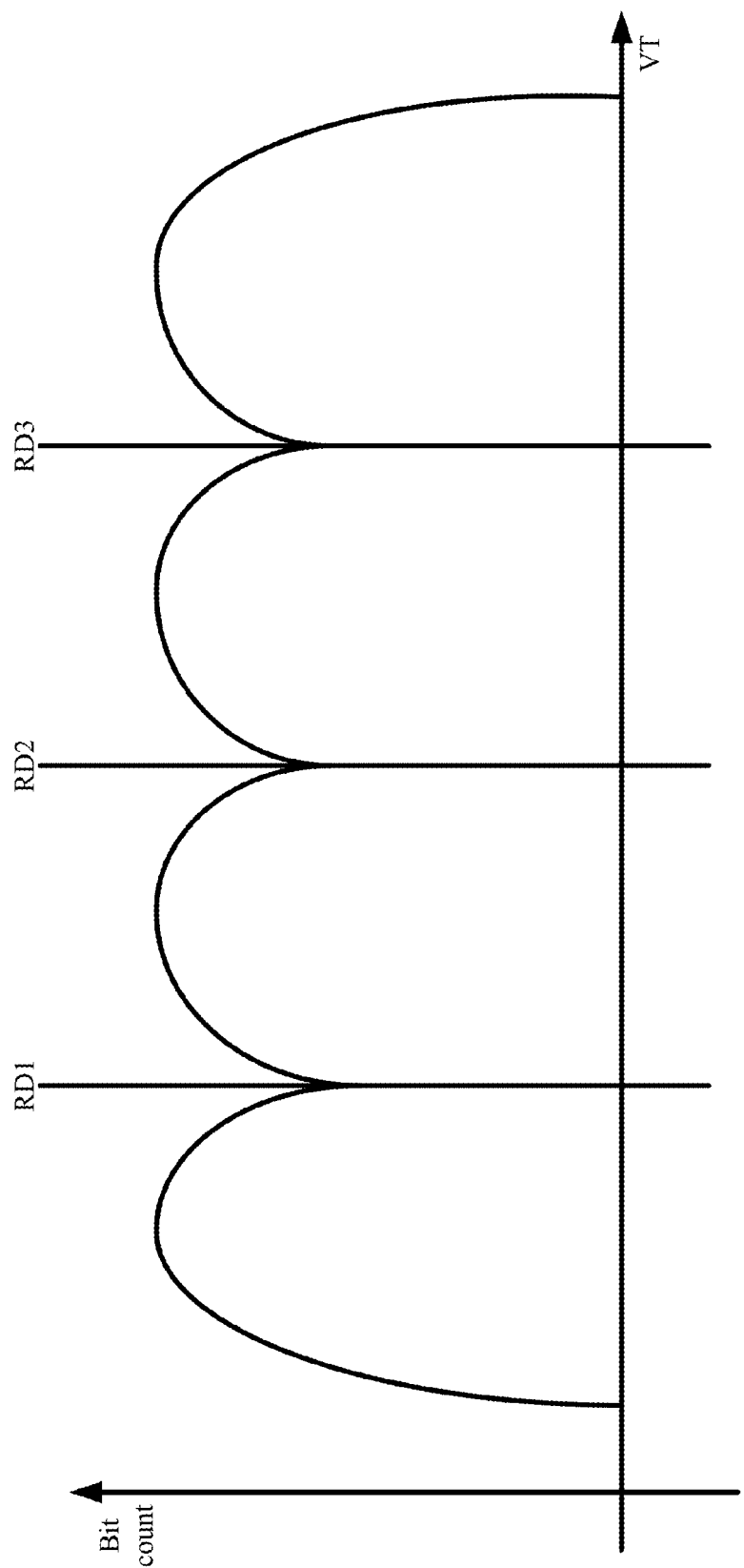
FIG. 1 is a graph of threshold voltage versus bit count, with read reference voltages separating the voltage ranges representing different data values stored by the memory cells.

FIG. 1 is a graph of threshold voltage versus bit count, with read reference voltages separating the voltage ranges representing different data values stored by the memory cells.

Figure 9:
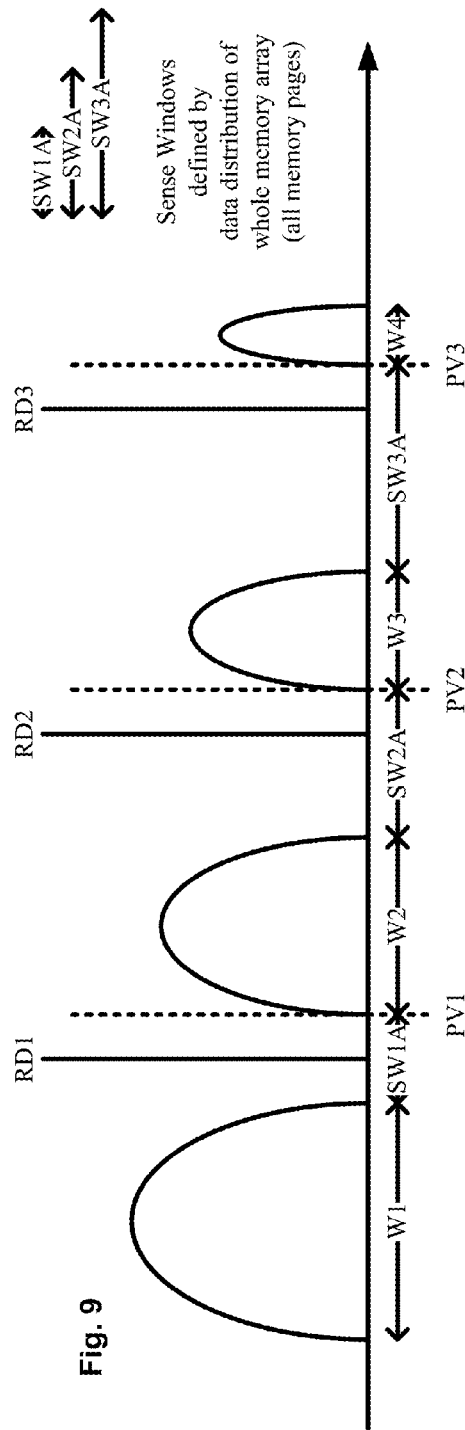
FIG. 9 is a threshold definition of a memory group such as a page, showing threshold voltage ranges representing different data values, and read reference voltages and sense windows that are defined by the data distribution across the whole memory array. For example, the data distribution across the whole memory array may be as shown in FIG. 1.
Figure 10:
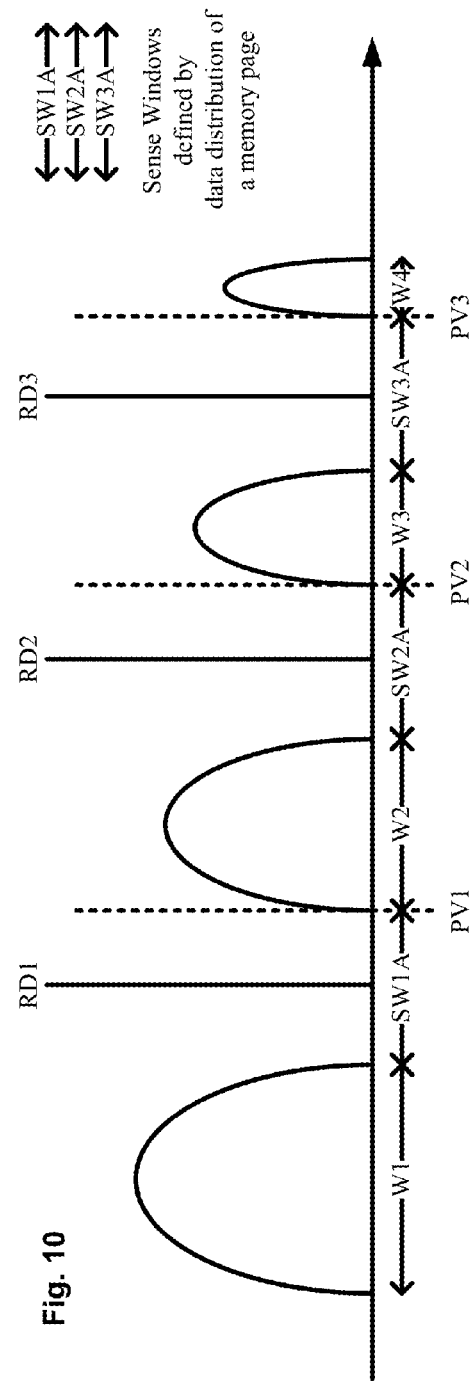
FIG. 10 is a threshold definition of a memory group such as a page, showing threshold voltage ranges representing different data values, and read reference voltages and sense windows that are defined by the data distribution across the memory page.

Read reference voltages—RD1, RD2, RD3—are at the minima of the threshold voltage distribution of the memory cells across the whole memory array. During a read operation, a memory cell is determined as storing a particular data value, depending on whether the threshold voltage of the memory cell is above or below particular read reference voltages. The read reference voltages separate the threshold voltage distribution into several threshold voltage ranges that represent different data values. A first threshold voltage range up to RD1 represents a first data value. A second threshold voltage range between RD1 and RD2 represents a second data value. A third threshold voltage range between RD2 and RD3 represents a third data value. A fourth threshold voltage range down to RD3 represents a fourth data value. In practical threshold definitions, threshold voltage ranges are separated by sense windows, as shown in FIGS. 4, 9, and 10.

Figure 2:
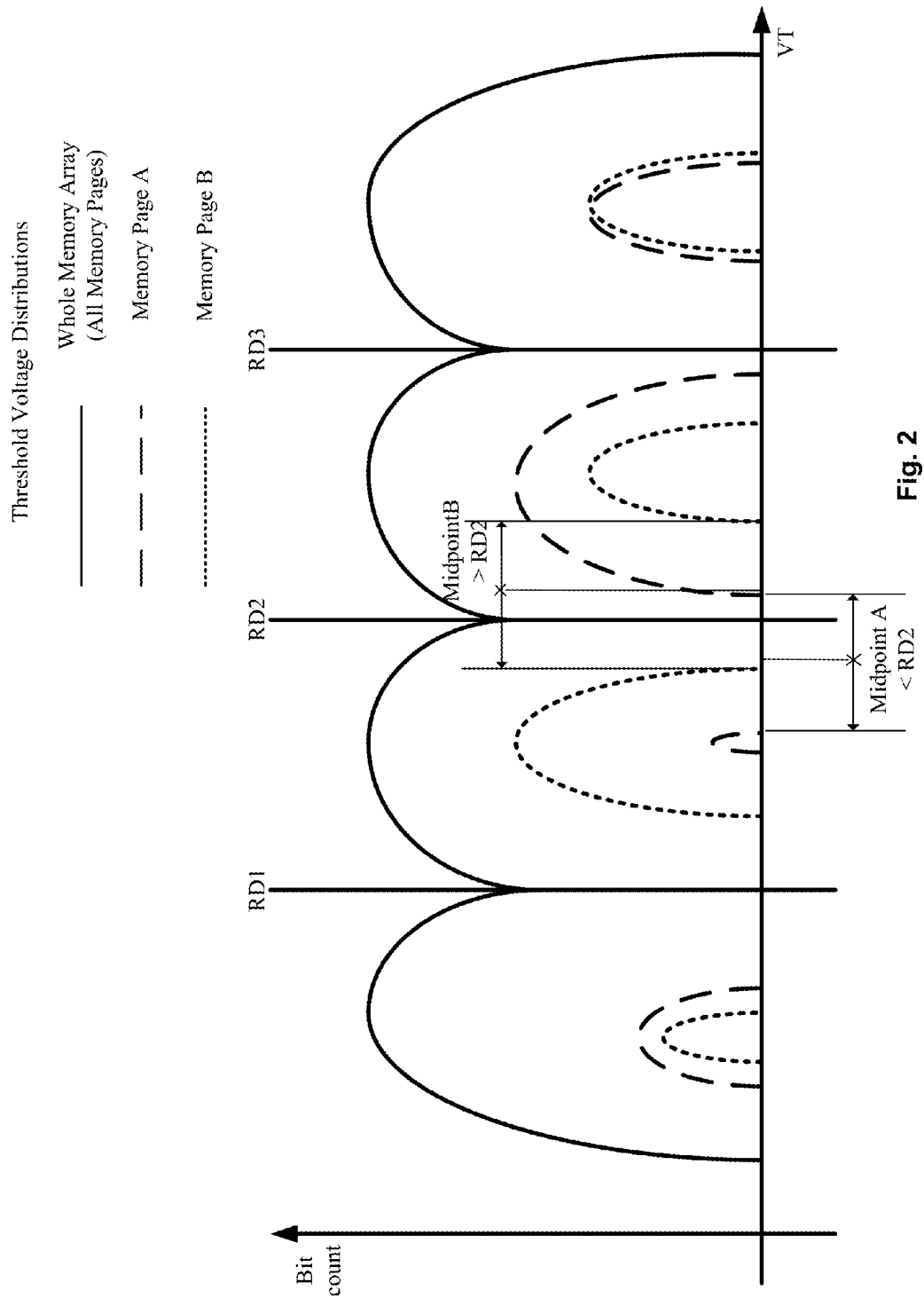
FIG. 2 is a graph of threshold voltage versus bit count for the whole memory array, and threshold voltage versus bit count for two different memory pages in the memory array. For particular data values stored by memory cells in the memory pages, the two different memory pages have threshold voltage ranges of different widths representing the particular data values.

FIG. 2 is a graph of threshold voltage versus bit count for the whole memory array, and threshold voltage versus bit count for two different memory pages in the memory array. For particular data values stored by memory cells in the memory pages, the two different memory pages have threshold voltage ranges of different widths representing the particular data values. Memory page A has a set of threshold voltage distributions shown with long-dashed lines, and Memory page B has a set of threshold voltage distributions shown short-dashed lines.

For a first threshold voltage range up to RD1 representing a first data value, memory page A has a larger threshold voltage distribution with a wider threshold voltage range, compared to memory page B. The width of a threshold voltage range of a particular threshold voltage distribution (which represent a particular data value) varies with the number of bits in the particular threshold voltage distribution. For a second threshold voltage range between RD1 and RD2 representing a second data value, memory page A has a much smaller threshold voltage distribution with a much narrower threshold voltage range, compared to memory page B. For a third threshold voltage range between RD2 and RD3 representing a third data value, memory page A has a much larger threshold voltage distribution with a much wider threshold voltage range, compared to memory page B. For a fourth threshold voltage range down to RD3 representing a fourth data value, memory page A and memory page B have similar threshold voltage distributions with similar threshold voltage ranges.

FIG. 2 shows that, different memory pages in a same memory array have widely varying data distributions, with widely varying threshold voltage distributions and threshold voltage ranges that represent the different data values stored in the memory pages. Despite these widely varying threshold voltage distributions of different memory pages, the read reference voltages shown in FIG. 2—RD1, RD2, RD3—are determined by the threshold voltage distribution of the memory cells across the whole memory array.

The read reference voltages shown in FIG. 2 are generally not at the midpoint between neighboring threshold voltage distributions of a memory page. For example, with memory pages A and B, read reference voltage RD2 is not at the midpoint of the two adjacent threshold voltage ranges (the midpoint of, the maximum of the lower adjacent threshold voltage range, and the minimum of the higher adjacent threshold voltage range). Instead, read reference voltage RD2 is to the right of the actual midpoint between the two adjacent threshold voltage ranges for memory page A, and read reference voltage RD2 is to the left of the actual midpoint between the two adjacent threshold voltage ranges for memory page B. Because the actual midpoints between adjacent threshold voltage ranges are different from the read reference voltages, the different memory pages have nonideal read reference voltages and nonideal sense windows.

Figure 3:
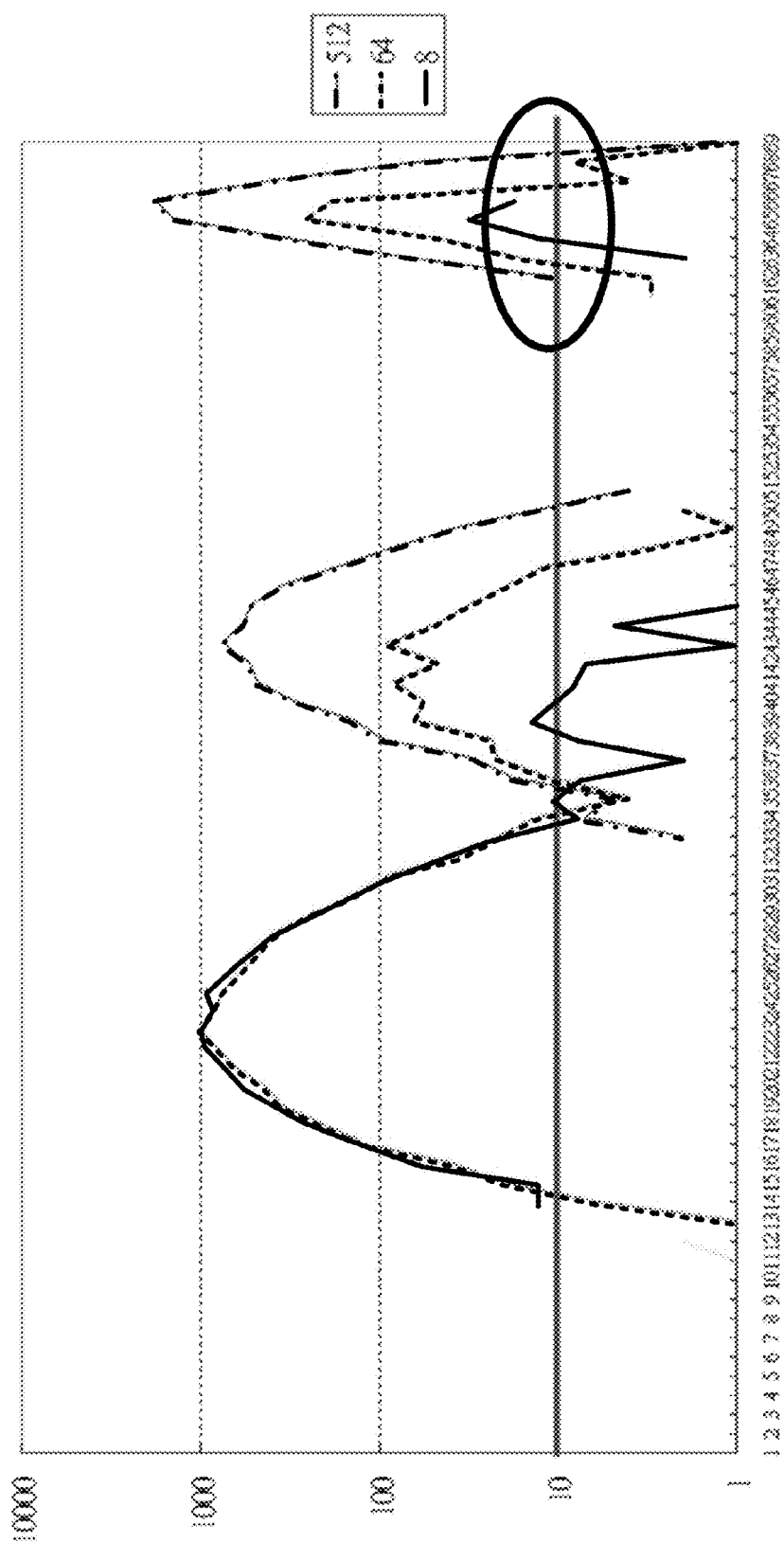
FIG. 3 is a graph of threshold voltage versus bit count for memory groups of different size, showing that the threshold voltage ranges corresponds to the sizes of the memory groups (such as pages).

FIG. 3 is a graph of threshold voltage versus bit count for memory groups of different size, showing that the threshold voltage ranges corresponds to the sizes of the memory groups (such as pages).

To the right of the graph, three nested threshold voltage distributions are nested together. The three nested threshold voltage distributions correspond to 512 bytes in the distribution, 64 bytes in the distribution, and 8 bytes in the distribution. The circled parts of these three nested threshold voltage distributions show that, the smaller the bit count of a distribution, the narrower the distribution width (threshold voltage range)

FIG. 4 is a threshold definition, showing threshold voltage ranges representing different data values, and sense windows separating the threshold voltage ranges, where the threshold voltage ranges have varying widths.

The read reference voltages are RD1, RD2, RD3. A first threshold voltage range representing a first data value has a width determined by width W1 and twice the additional distribution width DW1 (one on either side of W1). The maximum of width W1 is at B2_min, which is determined by fabrication data.

A second threshold voltage range representing a second data value has a width determined by width W2 and twice the additional distribution width DW2 (one on either side of W2). The minimum of the second threshold voltage range is the program verify voltage PV1.

A third threshold voltage range representing a third data value has a width determined by width W3 and twice the additional distribution width DW3 (one on either side of W3). The minimum of the third threshold voltage range is the program verify voltage PV2.

A fourth threshold voltage range representing a fourth data value has a width determined by width W4 and twice the additional distribution width DW4 (one on either side of W4). The minimum of width W4 is at B7_min, which is determined by fabrication data. The minimum of the fourth threshold voltage range is the program verify voltage PV4.

The sense window SW1 separates the first and second threshold voltage ranges. The sense window SW2 separates the second and third threshold voltage ranges. The sense window SW3 separates the third and fourth threshold voltage ranges.

An example window definition follows. In the example window definition, the sense windows SW1, SW2, and SW3 have equal widths. Also in the example window definition, the read reference voltages RD1, RD2, RD3 are at the midpoints of the respective sense windows SW1, SW2, and SW3. The program verify voltages PV1, PV2, PV3 are at the maximums of the respective sense windows SW1, SW2, and SW3.

$$SW1 = [(B7\text{min} - B2\text{min}) - DW1 - (W2 + 2 \times DW2) - (W3 + 2 \times DW3) - DW4] \times \tfrac{1}{3}$$

$$SW2 = [(B7\text{min} - B2\text{min}) - DW1 - (W2 + 2 \times DW2) - (W3 + 2 \times DW3) - DW4] \times \tfrac{1}{3}$$

$$SW3 = [(B7\text{min} - B2\text{min}) - DW1 - (W2 + 2 \times DW2) - (W3 + 2 \times DW3) - DW4] \times \tfrac{1}{3}$$

$$RD1 = (B2\text{min} + DW1 + 0.5 \times SW1)$$

$$PV1 = (RD1 + 0.5 * SW1)$$

$$RD2 = [PV1 + (W2 + 2 \times DW2) + 0.5 \times SW2]$$

$$PV2 = (RD2 + 0.5 * SW2)$$

$$RD3 = [PV2 + (W3 + 2 \times DW3) + 0.5 \times SW3]$$

$$PV3 = (RD3 + 0.5 * SW3)$$

Another example window definition follows. In the example window definition, the sense windows SW1, SW2, and SW3 have relative widths that depend on the respective values of ratio1, ratio2, ratio3, where 0<ratio#<1, and ratio1+ratio2+ratio3=1. Also in the example window definition, the read reference voltages RD 1, RD2, RD3 are at relative positions in the respective sense windows SW1, SW2, and SW3 that depend on the respective values of r1, r2, r3, where 0<r#<1. The program verify voltages PV1, PV2, PV3 are at the maximums of the respective sense windows SW1, SW2, and SW3.

$$SW1 = [(B7\text{min} - B2\text{min}) - DW1 - (W2 + 2 \times DW2) - (W3 + 2 \times DW3) - DW4] \times (\text{ratio1})$$

$$SW2 = [(B7\text{min} - B2\text{min}) - DW1 - (W2 + 2 \times DW2) - (W3 + 2 \times DW3) - DW4] \times (\text{ratio2})$$

$$SW3 = [(B7\text{min} - B2\text{min}) - DW1 - (W2 + 2 \times DW2) - (W3 + 2 \times DW3) - DW4] \times (\text{ratio3})$$

$$RD1 = (B2\text{min} + DW1 + r1 \times SW1)$$

$$PV1 = (RD1 + (1 - r1) * SW1)$$

$$RD2 = [PV1 + (W2 + 2 \times DW2) + r2 \times SW2]$$

$$PV2 = (RD2 + (1 - r2) * SW2)$$

$$RD3 = [PV2 + (W3 + 2 \times DW3) + r3 \times SW3]$$

$$PV3 = (RD3 + (1 - r3) * SW3)$$

FIGS. 5-8 are tables showing that, as a memory group such as a page stores a different relative quantity (relative bit count) of a particular data value, the following vary: the threshold voltage distribution representing the particular data value, and the delta width which determines the threshold voltage range representing the particular data value. The actual values of the delta width vary with the manufacturing process and program algorithm.

In the example of FIGS. 5-8, there are four possible data values stored in a particular memory cell location. The four possible data values are presented by the four threshold voltage distributions, Distribution_1, Distribution_2, Distribution_3, and Distribution_4. The size of each of Distribution_1, Distribution_2, Distribution_3, and Distribution_4 depends on the bit count of each data value represented by the respective threshold voltage distribution. FIGS. 5, 6, 7, 8 respectively shows details about Distribution_1, Distribution_2, Distribution_3, and Distribution_4.

In one example, there are a total of 100 bits in a memory group. The absolute distribution is 25 bits in Distribution_1, 25 bits in Distribution_2, 25 bits in Distribution_3, and 25 bits in Distribution_4. The relative distribution is 25% in Distribution_1, 25% in Distribution_2, 25% in Distribution_3, and 25% in Distribution_4. According to respective FIGS. 5-8, the relative distribution of 25% is the second entry in the table in each of Distribution_1, Distribution_2, Distribution_3, and Distribution_4. According to FIG. 5 for Distribution_1, distribution 11 is chosen with delta width DW11. According to FIG. 6 for Distribution_2, distribution 21 is chosen with delta width DW21. According to FIG. 7 for Distribution_3, distribution 31 is chosen with delta width DW31.

FIG. 9 is a threshold definition of a memory group such as a page, showing threshold voltage ranges representing different data values, and read reference voltages and sense windows that are defined by the data distribution across the whole memory array. For example, the data distribution across the whole memory array may be as shown in FIG. 1. As explained in connection with FIG. 2, the variable data distribution of different memory pages results in nonideal read reference voltages and nonideal sense windows. Accordingly, sense window SW3A is about twice as wide as sense window SW1A. Sense window SW2A has a median width in between the widths of SW1A and SW3A.

FIG. 10 is a threshold definition of a memory group such as a page, showing threshold voltage ranges representing different data values, and read reference voltages and sense windows that are defined by the data distribution across the memory page.

After the four threshold voltage distributions are defined, then the remainder of the threshold definition is equally divided among the sense windows SW1A, SW2A, and SW3A. The read reference voltages RD1, RD2, and RD3 are placed at the midpoints of the respective sense windows SW1A, SW2A, and SW3A. One or more of the sense windows SW1A, SW2A, and SW3A have been changed in width and in position in the threshold definition.

Figure 11:
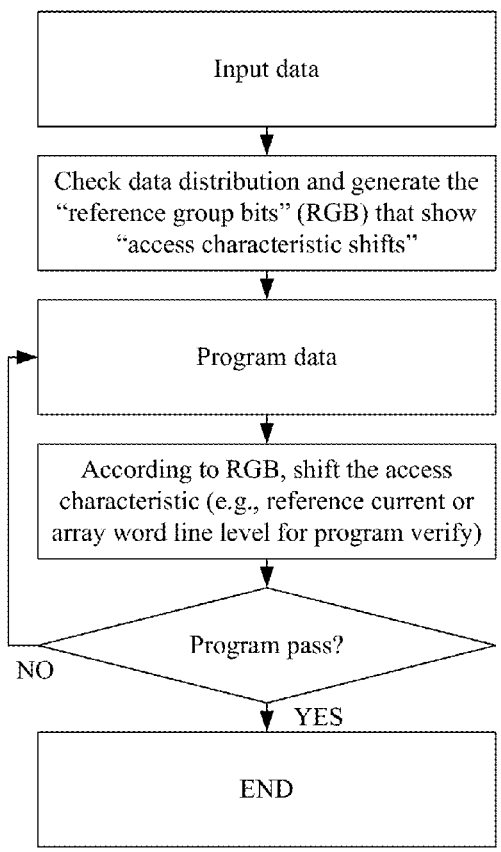
FIGS. 11-12 are example process flows that show programming of data according to the data distribution of the memory group (such as a page), and the stored reference group bit (or access characteristic shift data) about the memory group.
Figure 12:
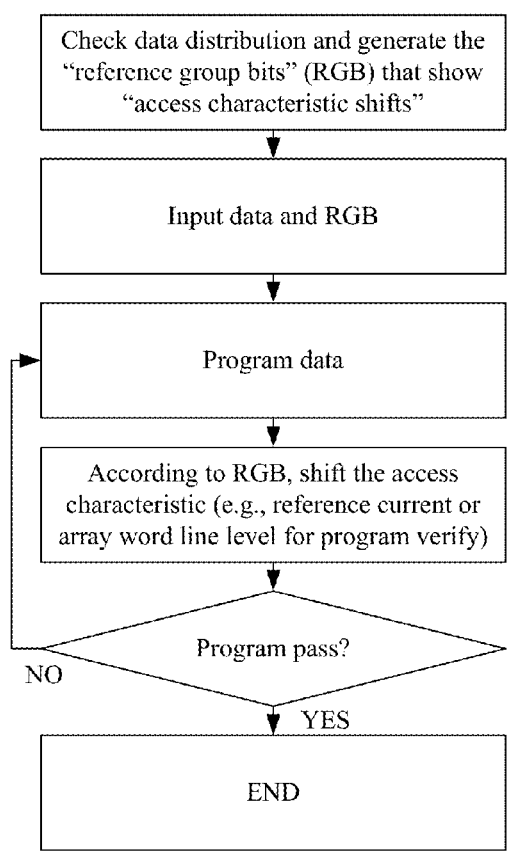

FIGS. 11-12 are example process flows that show programming of data according to the data distribution of the memory group (such as a page), and the stored reference group bit (or access characteristic shift data) about the memory group.

In FIG. 11, the process flow begins with input of new data to be programmed into a particular memory group. The new data can be input into a tester with the integrated circuit with the memory array, or into the integrated circuit with the memory array without the tester. Determination of the data distribution can be performed by the tester or by control circuitry on the integrated circuit. The "reference group bits" (RGB) are generated which determine the access characteristic shifts (e.g., shifts in programming characteristics or read characteristics) to access the particular memory group. Examples of access characteristic shifts are shifts in reference current for program verify, and shifts in array word line level for program verify, based on the threshold definition as determined by the data distribution in the memory group. Then, the new data are programmed. Program verify is performed on the newly programmed data, adjusted by the access characteristic shifts described by the RGB. If program verify passes, then the programming is complete. Otherwise, if program verify fails, programming of the data is repeated.

FIG. 12 is similar to FIG. 11. However, in FIG. 12, the present data distribution of the particular memory group is determined, and the RGB are generated, prior to receiving the new data to be programmed. By contrast, in FIG. 11, the RGB are generated based on the data distribution which includes data stored in the memory group prior to programming, and the new data to be programmed.

Figure 13:
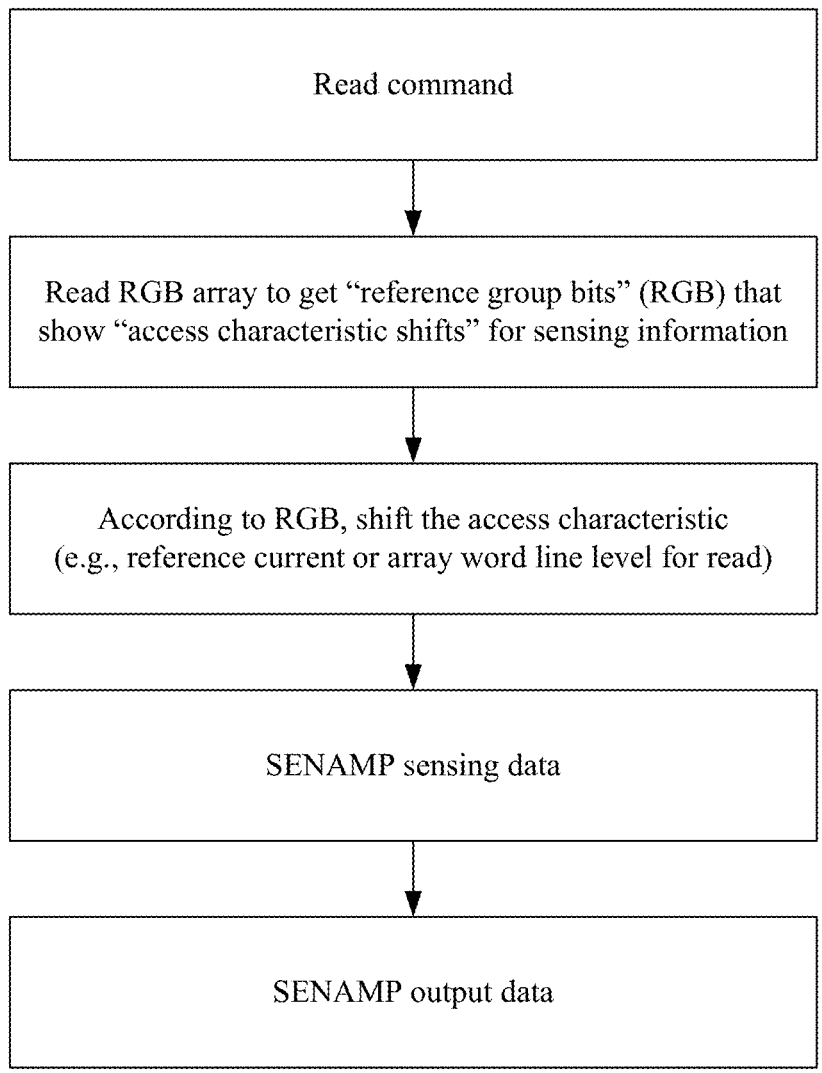
FIG. 13 is an example process flow that show reading of data according to the data distribution of the memory group (such as a page), and the stored reference group bit, or access characteristic shift data, about the memory group.

FIG. 13 is an example process flow that show reading of data according to the data distribution of the memory group (such as a page), and the stored reference group bit, or access characteristic shift data, about the memory group.

In response to a read command, the RGB array is read to get the RGB data show access characteristics shifts (e.g., shifts in programming characteristics or read characteristics) to access the particular memory group. According to the RGB data, the access characteristic is shifted, such as a reference current for read or array word line level for read, based on the threshold definition as determined by the data distribution in the memory group. The sense amplifier senses data according to the shifted access characteristic, and the sense amplifier outputs the sensed data.

Figure 14:
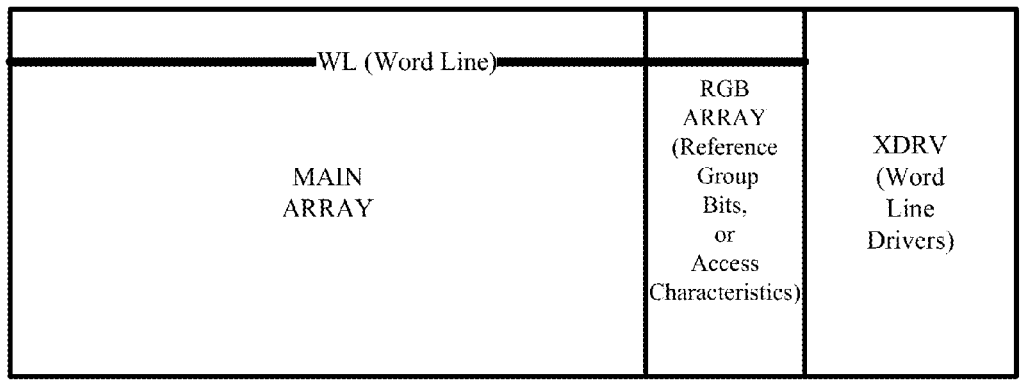
FIG. 14 is an example block diagram of a memory array with the main array positioned farther away from the word line drivers than the array storing reference group bits, or access characteristic shift data.

FIG. 14 is an example block diagram of a memory array with the main array positioned farther away from the word line drivers than the array storing reference group bits, or access characteristic shift data.

Word lines extend from the XDRV (word line drivers) through the RGB array (for reference group bits, or access characteristics, also called the reference array) and then through the main array. Because the reference array is accessed by a portion of the word line closer to the word line drivers, the portion of the word line which accesses the reference array charges faster and completes setup faster. Because the main array is accessed by a portion of the word line farther from the word line drivers, the portion of the word line which accesses the main array charges slower and completes setup slower.

Figure 15:
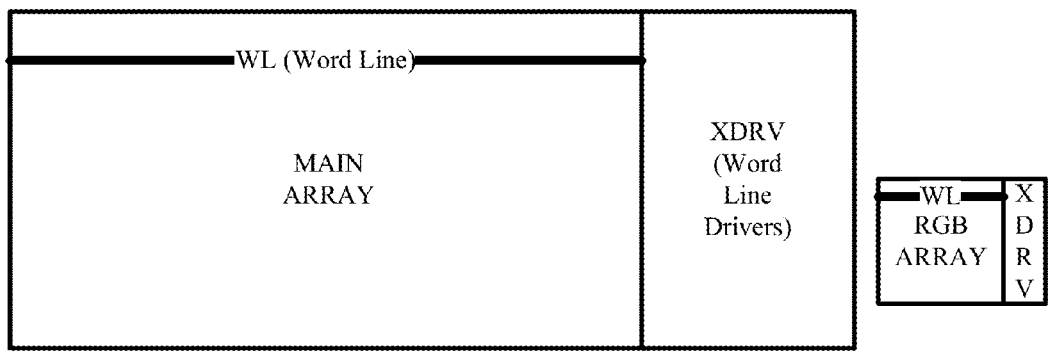
FIG. 15 is an example block diagram of a memory array with a larger main array having longer word lines, and a smaller array storing reference group bits or access characteristic shift data) having shorter word lines.

FIG. 15 is an example block diagram of a memory array with a larger main array having longer word lines, and a smaller array storing reference group bits or access characteristic shift data) having shorter word lines.

In the larger memory array, word lines extend from the XDRV (word line drivers) through the main array. In the smaller memory array, word lines extend from the XDRV (word line drivers) through the RGB array (for reference group bits, or access characteristics, also called the reference array). Because the reference array is accessed by shorter word lines, a word line which accesses the reference array charges faster and completes setup faster. Because the main array is accessed by a longer word lines, a word line which accesses the main array charges slower and completes setup slower.

Figure 16:
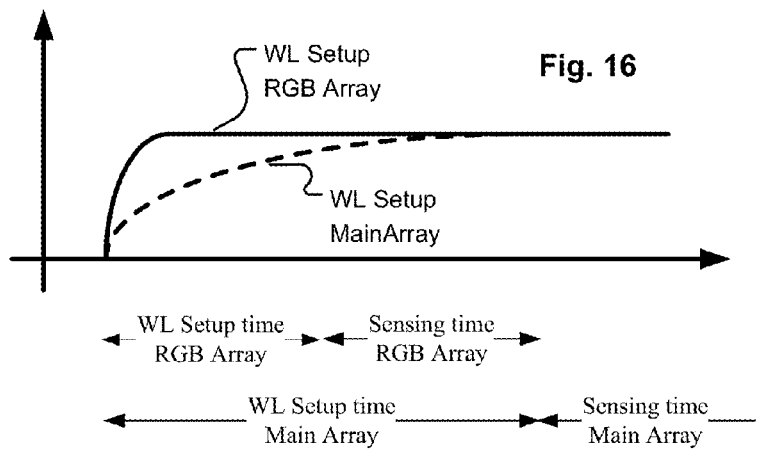
FIG. 16 is a graph showing the different setup times for the main array and the array storing reference group bits or access characteristic shift data).

FIG. 16 is a graph showing the different setup times for the main array and the array storing reference group bits or access characteristic shift data).

According to either the embodiments shown in FIG. 14 or 15, the word line setup time for the reference array, and the sensing time to retrieve RGB from the reference array, are completed during the word line setup time for the main array. IN this way, memory operations are not delayed by waiting for access of the RGB data.

Figure 17:
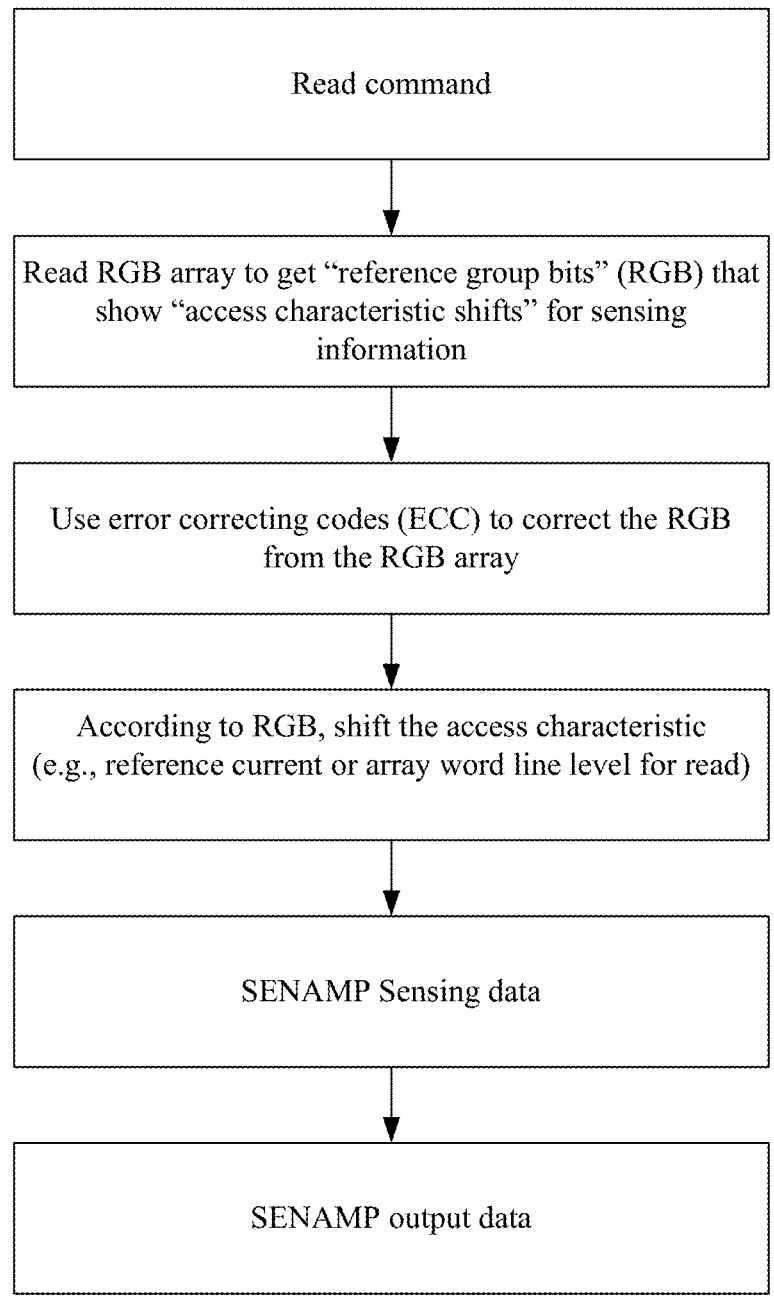
FIG. 17 is an example process flow that show reading of data according to the data distribution of the memory group (such as a page), and the stored reference group bit (or access characteristic shift data) about the memory group, using error correcting codes.

FIG. 17 is an example process flow that show reading of data according to the data distribution of the memory group (such as a page), and the stored reference group bit (or access characteristic shift data) about the memory group, using error correcting codes.

This read process flow is similar to the read process flow of FIG. 13, but with the addition of error correction. In response to a read command, the reference array is read to get the RGB data that show access characteristic shifts (e.g., shifts in read characteristics) to access the particular memory group. Error correcting codes are used to correct errors in the RGB data from the reference array. The ECC feature can be a hardware feature of the memory, or a software feature at the cost of extra delay. According to the RGB data, the access characteristic is shifted, such as a reference current for read or array word line level for read, based on the threshold definition as determined by the data distribution in the memory group. The sense amplifier senses data according to the shifted access characteristic, and the sense amplifier outputs the sensed data.

Figure 18:
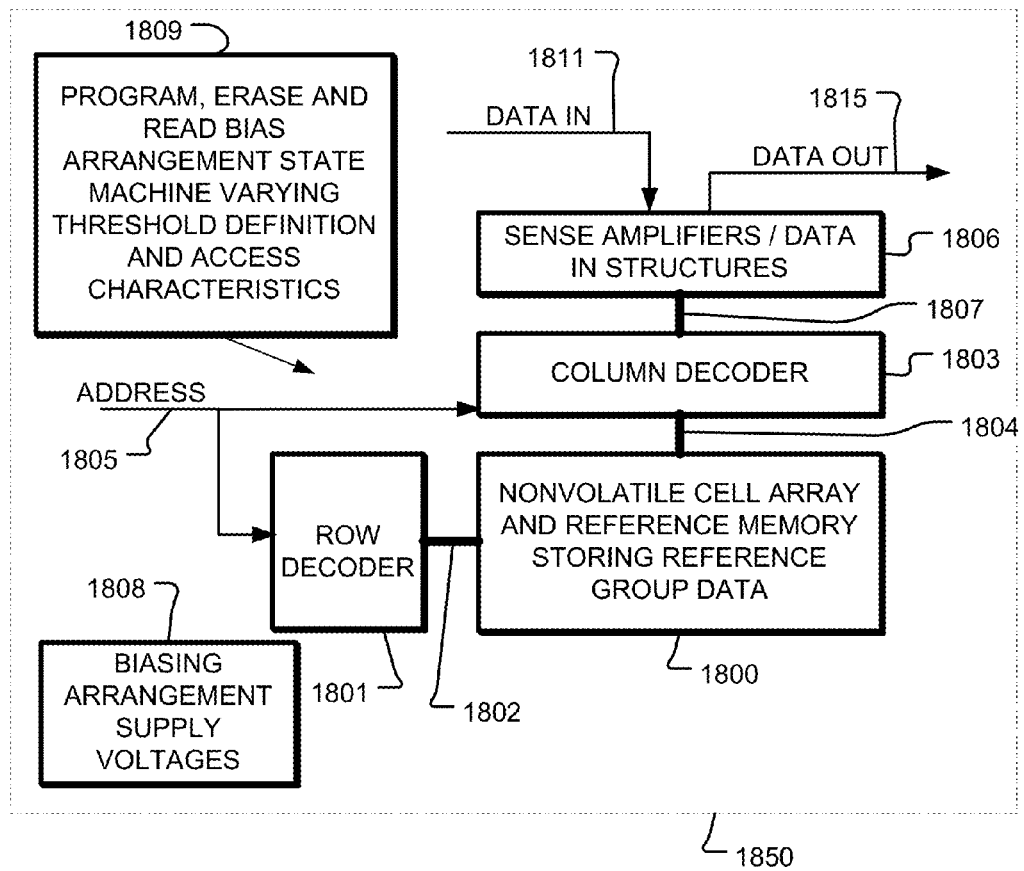
FIG. 18 is a block diagram of a memory integrated circuit with the improvements described herein.

FIG. 18 is a block diagram of a memory integrated circuit with the improvements described herein. An integrated circuit 1850 includes a memory array 1800. A word line (or row) and block select decoder 1801 is coupled to, and in electrical communication with, a plurality 1802 of word lines and string select lines, and arranged along rows in the memory array 1800. A bit line (column) decoder and drivers 1803 are coupled to and in electrical communication with a plurality of bit lines 1804 arranged along columns in the memory array 1800 for reading data from, and writing data to, the memory cells in the memory array 1800. Addresses are supplied on bus 1805 to the word line decoder and drivers 1801 and to the bit line decoder 1803. Sense amplifiers and data-in structures in block 1806, including current sources for the read, program and erase modes, are coupled to the bit line decoder 1803 via the bus 1807. Data is supplied via the data-in line 1818 from input/output ports on the integrated circuit 1850, to the data-in structures in block 1806. Data is supplied via the data-out line 1815 from the sense amplifiers in block 1806 to input/output ports on the integrated circuit 1850, or to other data destinations internal or external to the integrated circuit 1850. Program, erase, and read bias arrangement state machine circuitry 1809 implements the varying threshold definition with threshold voltage ranges and sense windows adapted to the data distribution of different memory groups such as memory pages, and controls biasing arrangement supply voltages 1808.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a memory array with a threshold definition including (i) a plurality of threshold voltage ranges representing data values stored by a part of the memory array and (ii) a set of sense windows separating the plurality of threshold voltage ranges, wherein
the threshold definition is varied for the part of the memory array, responsive to at least one of program operations and erase operations that change a distribution of the data values stored in the part of the memory array, such that threshold definition of a particular memory cell in the part of the memory array is dependent on the data values stored in other memory cells in the part of the memory array.

2. The integrated circuit of claim 1, wherein the memory array is divided into a plurality of memory groups, and memory groups in the plurality of memory groups are characterized by threshold definitions specific to the memory groups, and the threshold definition is varied for a memory group of the plurality of memory groups, responsive to at least one of program operations and erase operations that change a distribution of the data values stored in the memory group.

3. The integrated circuit of claim 1, further comprising:
control circuitry that varies the threshold definition.

4. The integrated circuit of claim 1, wherein a tester varies the threshold definition.

5. The integrated circuit of claim 1, wherein the threshold definition is varied, by varying the threshold voltage ranges.

6. The integrated circuit of claim 1, wherein the threshold definition is varied, by deciding widths of the threshold voltage ranges based on a relative distribution of the data values.

7. The integrated circuit of claim 1, wherein the threshold definition is varied, by deciding widths of the plurality of threshold voltage ranges, such that within the part of the memory array, a first threshold voltage range is wider than a second threshold voltage range, responsive to the part of the memory array storing a larger relative quantity of a first data value represented by the first threshold voltage range relative to a second data value represented by the second threshold voltage range.

8. The integrated circuit of claim 1, wherein the threshold definition is varied, by varying the set of sense windows.

9. The integrated circuit of claim 1, wherein the threshold definition is varied, by varying at least one position of at least one of the sense windows in the threshold definition.

10. The integrated circuit of claim 1, further comprising:
reference memory storing at least one access characteristic shift for the part of the memory array that compensates for varying of the threshold definition for the part of the memory array,
wherein the at least one access characteristic shift includes one or more of:
a reference current shift for program verify in the part of the memory array, a word line level shift for program verify in the part of the memory array, a reference current shift for read in the part of the memory array, and a word line level shift for read in the part of the memory array; and
wherein the part of the memory array is accessed according to the at least one access characteristic shift in the reference memory.

11. The integrated circuit of claim 1, further comprising:
reference memory storing at least one access characteristic shift for the part of the memory array that modifies access of the part of the memory array,
wherein a read time of the reference memory is no longer than a word line setup time to access the part of the memory array.

12. The integrated circuit of claim 1, further comprising:
word line drivers coupled to the memory array;
wherein the memory array includes reference memory storing at least one access characteristic shift for the part of the memory array that compensates for varying of the threshold definition for the part of the memory array, and the reference memory for the part of the memory array is closer than the part of the memory array to the word line drivers.

13. The integrated circuit of claim 1, further comprising:
a first plurality of word lines having a first length accessing the memory array;
a second memory array including reference memory storing at least one access characteristic shift for the part of the memory array that compensates for varying of the threshold definition for the part of the memory array;
a second plurality of word lines having a second length accessing the second memory array, the second length being shorter than the first length.

14. The integrated circuit of claim 1, further comprising:
reference memory storing at least one access characteristic shift for the part of the memory array that compensates for varying of the threshold definition for the part of the memory array,
wherein the reference memory is accessed with error correcting codes.

15. The integrated circuit of claim 1, wherein the threshold definition is varied, responsive to different relative quantities of the data values stored by the part of the memory array.

16. The integrated circuit of claim 15, wherein the relative quantities are any of a fraction, percentage, and a ratio of a first quantity of one of the data values stored in the part of the memory array relative to one or more other quantities of one or more other data values stored in the part of the memory array.

17. A method, comprising:
varying a threshold definition of a part of a memory array, responsive to at least one of program operations and erase operations that change a distribution of the values stored in the part of the memory array,
wherein the part of the memory array is characterized by the threshold definition including (i) a plurality of threshold voltage ranges representing data values stored by the part of the memory array and (ii) a set of sense windows separating the plurality of threshold voltage ranges, such that threshold definition of a particular memory cell in the part of the memory array is dependent on the data values stored in other memory cells in the part of the memory array.

18. The method of claim 17, wherein varying the threshold definition, includes:
varying at least one position of at least one of the sense windows in the threshold definition.

19. The method of claim 17, further comprising:
reading reference memory storing at least one access characteristic shift for the part of the memory array that compensates for varying of the threshold definition for the part of the memory array; and
accessing the part of the memory array according to the at least one access characteristic shift.

20. The method of claim 17, further comprising:
reading reference memory storing at least one access characteristic shift for the part of the memory array that compensates for varying of the threshold definition for the part of the memory array, within a read time that is no longer than a setup time to access the part of the memory array.

21. An integrated circuit, comprising:
a memory array with a threshold definition including (i) a plurality of threshold voltage ranges representing data values stored by a part of the memory array and (ii) a set of sense windows separating the plurality of threshold voltage ranges, wherein
the threshold definition is varied based on relative quantities of the data values stored by the part of the memory array.

22. The integrated circuit of claim 21, wherein the threshold definition is varied, responsive to at least one of program operations and erase operations that change a distribution of the data values stored in the part of the memory array.

23. The integrated circuit of claim 21, wherein the relative quantities are any of a fraction, percentage, and a ratio of a first quantity of one of the data values stored in the part of the memory array relative to one or more other quantities of one or more other data values stored in the part the memory array.

* * * * *